US009734745B2

(12) United States Patent
Gu

(10) Patent No.: US 9,734,745 B2
(45) Date of Patent: *Aug. 15, 2017

(54) SUBPIXEL ARRANGEMENTS OF DISPLAYS AND METHOD FOR RENDERING THE SAME

(71) Applicant: SHENZHEN YUNYINGGU TECHNOLOGY CO., LTD, Shenzhen (CN)

(72) Inventor: Jing Gu, Shanghai (CN)

(73) Assignee: SHENZHEN YUNYINGGU TECHNOLOGY CO., LTD (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/308,346

(22) Filed: Jun. 18, 2014

(65) Prior Publication Data

US 2014/0300626 A1 Oct. 9, 2014

Related U.S. Application Data

(63) Continuation of application No. 13/215,896, filed on Aug. 23, 2011, now Pat. No. 8,786,645.

(30) Foreign Application Priority Data

Jul. 29, 2011 (CN) .......................... 2011 1 0215027

(51) Int. Cl.
*G09G 3/20* (2006.01)
*G09G 3/36* (2006.01)
(Continued)

(52) U.S. Cl.
CPC ......... *G09G 3/2003* (2013.01); *G09G 3/3208* (2013.01); *G09G 3/3607* (2013.01);
(Continued)

(58) Field of Classification Search
CPC .............. G09G 5/02; H05B 33/00; G02F 1/13
See application file for complete search history.

(56) References Cited

U.S. PATENT DOCUMENTS 5,619,225 A * 4/1997 Hashimoto ...................... 345/98
6,252,613 B1 * 6/2001 Borel ................... G09G 3/2003
345/531

(Continued)

FOREIGN PATENT DOCUMENTS

CN 1550846 A 1/2004
CN 1539129 A 10/2004
(Continued)

OTHER PUBLICATIONS

PCT Search Report and PCT Written Opinion dated Sep. 13, 2012 for corresponding PCT Application No. PCT/CN2012/075879.
(Continued)

*Primary Examiner* — Kenneth Bukowski
(74) *Attorney, Agent, or Firm* — Sterne, Kessler, Goldstein & Fox P.L.L.C.

(57) ABSTRACT

An apparatus including a display and control logic is provided. In one example, the display includes an array of subpixels having a plurality of zigzag subpixel groups. Each zigzag subpixel group includes at least three zigzag subpixel units arranged adjacently along a horizontal or vertical direction. Each zigzag subpixel unit includes a plurality of subpixels of the same color arranged in a zigzag pattern. In each zigzag subpixel unit, a first plurality of subpixels are arranged along one diagonal direction from a turning subpixel disposed at a turning corner of the zigzag pattern, and a second plurality of subpixels are arranged along another diagonal direction from the turning subpixel. In another example, the display includes an array of subpixels having a novel subpixel repeating group. The control logic is
(Continued)

operatively coupled to the display and configured to receive display data and render the display data into control signals for driving the display.

21 Claims, 16 Drawing Sheets

(51) Int. Cl.
G09G 5/02 (2006.01)
H01L 27/02 (2006.01)
G09G 3/3208 (2016.01)
H01L 27/32 (2006.01)

(52) U.S. Cl.
CPC .......... *G09G 5/02* (2013.01); *H01L 27/0207* (2013.01); *G09G 2300/0426* (2013.01); *G09G 2300/0443* (2013.01); *G09G 2300/0452* (2013.01); *G09G 2320/0242* (2013.01); *G09G 2370/042* (2013.01); *H01L 27/3218* (2013.01)

(56) References Cited

U.S. PATENT DOCUMENTS

| | | | |
|---|---|---|---|
| 6,407,793 | B1 | 6/2002 | Liang |
| 7,184,066 | B2* | 2/2007 | Elliot et al. ............... 345/694 |
| 7,205,713 | B2 | 4/2007 | Kiguchi |
| 7,221,381 | B2 | 5/2007 | Brown Elliott et al. |
| 7,248,268 | B2 | 7/2007 | Brown Elliott et al. |
| 7,286,136 | B2 | 10/2007 | Phan |
| 7,397,455 | B2 | 7/2008 | Brown Elliott et al. |
| 7,505,053 | B2 | 3/2009 | Brown Elliott et al. |
| 7,583,279 | B2 | 9/2009 | Brown Elliott et al. |
| 8,786,645 | B2 | 7/2014 | Gu |
| 9,418,586 | B2 | 8/2016 | Gu |
| 2005/0052529 | A1 | 3/2005 | Mashitani et al. |
| 2005/0099378 | A1 | 5/2005 | Kim |
| 2005/0225563 | A1 | 10/2005 | Brown Elliott |
| 2006/0132668 | A1 | 6/2006 | Park et al. |
| 2006/0208981 | A1 | 9/2006 | Rho et al. |
| 2006/0274090 | A1 | 12/2006 | Koyama et al. |
| 2007/0070267 | A1 | 3/2007 | Yang |
| 2007/0146242 | A1* | 6/2007 | Miller ................ G09G 3/2074 345/76 |
| 2007/0176950 | A1 | 8/2007 | Brown Elliott et al. |
| 2008/0001525 | A1* | 1/2008 | Chao et al. ............... 313/500 |
| 2008/0002088 | A1 | 1/2008 | Ong |
| 2010/0013912 | A1 | 1/2010 | Lee et al. |
| 2010/0156954 | A1* | 6/2010 | Kim .................... G09G 3/3648 345/690 |
| 2010/0164978 | A1 | 7/2010 | Brown Elliott et al. |
| 2010/0208184 | A1 | 8/2010 | Shin et al. |
| 2011/0298789 | A1* | 12/2011 | Ko .................... H04N 13/0025 345/419 |

FOREIGN PATENT DOCUMENTS

| | | |
|---|---|---|
| CN | 1595226 A | 3/2005 |
| CN | 2906675 Y | 5/2007 |
| CN | 101051648 A | 10/2007 |
| CN | 101393366 A | 3/2009 |
| CN | 101409065 A | 4/2009 |
| CN | 101630068 A | 1/2010 |
| EP | 0572250 A1 | 12/1993 |
| EP | 0637009 A2 | 2/1995 |

OTHER PUBLICATIONS

European Search Report issued on Nov. 26, 2014 in EP Application No. 12820804.8.
Office Action issued on Feb. 28, 2015 in Chinese Application No. 201110215027.9.
Notice of Allowance issued Apr. 19, 2016 in U.S. Appl. No. 14/519,475.
English-language Abstract of CN 101393366 A.

* cited by examiner

RED  GREEN  BLUE

FIG. 10

SUBPIXEL ARRANGEMENTS OF DISPLAYS AND METHOD FOR RENDERING THE SAME

CROSS-REFERENCE TO RELATED APPLICATIONS

This application is a continuation of the U.S. patent application Ser. No. 13/215,896, filed on Aug. 23, 2011, which is hereby incorporated by reference in its entirety. This application claims priority to Chinese patent application No. 201110215027.9, filed on Jul. 29, 2011 with the State Intellectual Property Office of the People's Republic of China, which is hereby incorporated by reference in its entirety.

BACKGROUND

The disclosure relates generally to displays, and more particularly, to subpixel arrangements of displays and a method for rendering the same.

Displays are commonly characterized by display resolution, which is the number of distinct pixels in each dimension that can be displayed (e.g., 1920×1080). Many displays are, for various reasons, not capable of displaying different color channels at the same site. Therefore, the pixel grid is divided into single-color parts that contribute to the displayed color when viewed at a distance. In some displays, such as liquid crystal display (LCD), organic light emitting diode (OLED) display, electrophoretic ink (E-ink) display, or electroluminescent display (ELD), these single-color parts are separately addressable elements, which are known as subpixels.

Various subpixel arrangements (layouts, schemes) have been proposed to operate with a proprietary set of subpixel rendering algorithms in order to improve the display quality by increasing the apparent resolution of a display and by anti-aliasing text with greater details. For example, LCDs typically divide each pixel into three strip subpixels (e.g., red, green, and blue subpixels) or four quadrate subpixels (e.g., red, green, blue, and white subpixels) so that each pixel can present brightness and a full color. However, since human vision system is not as sensitive to brightness as to color, the known solutions of using three or four subpixels to constitute a full-color pixel are not always necessary.

Other known solutions take a different approach by dividing each pixel into two subpixels and arranging the subpixels tiled across the display in a specifically designed pattern. In order to keep the same apparent color resolution in a larger scale, it is necessary to design the subpixel arrangement so that the pixels in a line along any direction of the display can still present full colors. In other words, the subpixels in each direction of the display should include subpixels of the three primary colors (red, green, blue), preferably with the same number. However, these known solutions only partially meet the requirement in the horizontal and/or vertical direction but not in the diagonal direction. Thus, the color presentation capability in the diagonal direction is compromised in these known solutions, which may cause problems, for example, in displaying text. In addition, some of these known solutions divide each pixel into subpixels with different shapes and sizes, thereby causing extra hardship for manufacturing.

Accordingly, there exists a need for improved subpixel arrangements of displays and a method for rendering the same.

SUMMARY

The present disclosure describes subpixel arrangements of displays and a method for rendering the same. An apparatus including a display and control logic is provided. In one example, the display includes an array of subpixels having a plurality of zigzag subpixel groups. Each zigzag subpixel group includes at least three zigzag subpixel units arranged adjacently along a horizontal or vertical direction. Each zigzag subpixel unit includes a plurality of subpixels of the same color arranged in a zigzag pattern. In each zigzag subpixel unit, a first plurality of subpixels are arranged along one diagonal direction from a turning subpixel disposed at a turning corner of the zigzag pattern, and a second plurality of subpixels are arranged along another diagonal direction from the turning subpixel. In another example, the display includes an array of subpixels having a novel subpixel repeating group. The control logic is operatively coupled to the display and configured to receive display data and render the display data into control signals for driving the array of subpixels of the display.

A method for rendering subpixels of a display is also provided. The method may be implemented by the control logic of the apparatus or on any suitable machine having at least one processor. In one example, an arrangement of the array of subpixels provided above is identified. Display data in which, for each pixel for display, three parts of data for rendering three subpixels with different colors is received. The received display data is then converted into converted display data based on the identified arrangement of the array of subpixels. Control signals are then provided for rendering the array of subpixels of the display based on the converted display data.

Other concepts relate to software for implementing the method for rendering subpixels of a display. A software product, in accord with this concept, includes at least one machine-readable non-transitory medium and information carried by the medium. The information carried by the medium may be executable program code data regarding parameters in association with a request or operational parameters, such as information related to a user, a request, or a social group, etc. In one example, a machine readable and non-transitory medium having information recorded thereon for rendering subpixels of a display, where when the information is read by the machine, causes the machine to identify an arrangement of the array of subpixels provided above, receive display data including, for each pixel for display, three parts of data for rendering three subpixels with different colors, convert display data into converted display data based on the arrangement of the array of subpixels, and provide control signals for rendering the array of subpixels of the display based on the converted display data.

Among other advantages, the present disclosure provides the ability to reduce the number of subpixels while maintaining the same apparent display resolution, thereby reducing the cost and power consumption of the display, or to reduce the size of each pixel while keeping the same manufacturing process, thereby increasing the display resolution. Because each pixel in the present disclosure is divided equally into two subpixels instead of the conventional three strip subpixels or four quadrate subpixels, the number of addressable display elements per unit area of a display can be increased without changing the current manufacturing process. On the other hand, the novel subpixel arrangements of the present disclosure do not compromise the apparent color resolution of the display. For example, the pixels in a line along any direction of the display, including the diagonal direction, can present full colors.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The embodiments will be more readily understood in view of the following description when accompanied by the below figures and wherein like reference numerals represent like elements, wherein:

FIG. 10 is a depiction of another subpixel arrangement of a display defined by the zigzag subpixel group shown in FIG. 4A in accordance with one embodiment set forth in the disclosure;

DETAILED DESCRIPTION

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

Figure 1:
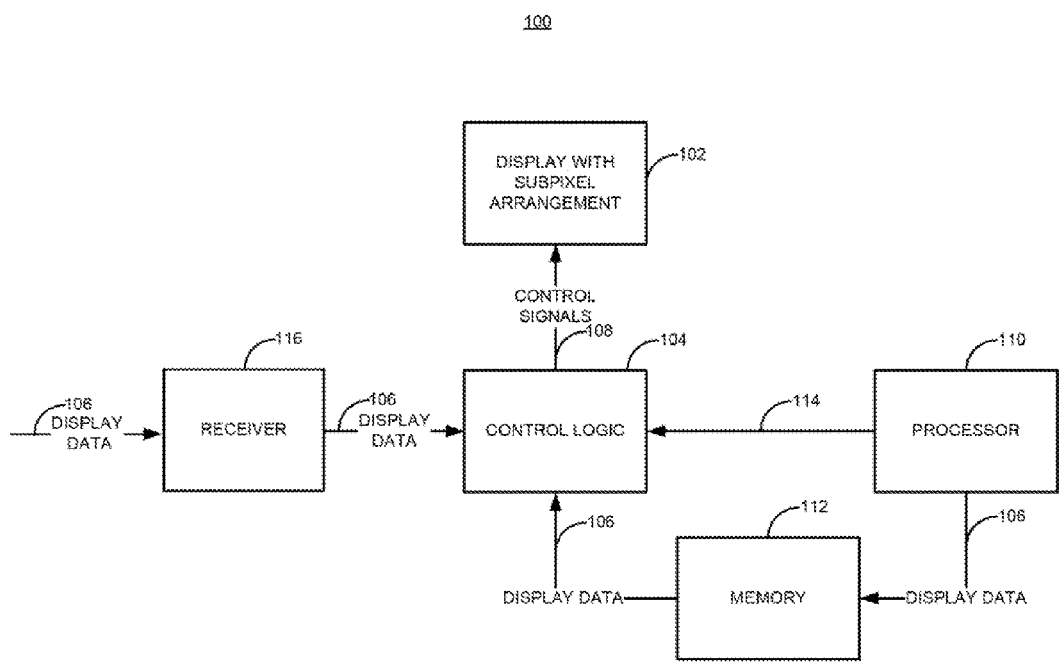
FIG. 1 is a block diagram illustrating an apparatus including a display and control logic.

FIG. 1 illustrates an apparatus 100 including a display 102 and control logic 104. The apparatus 100 may be any suitable device, for example, a television set, laptop computer, desktop computer, media center, handheld device (e.g., dumb or smart phone, tablet, etc.), electronic billboard, gaming console, set top box, printer, or any other suitable device. In this example, the display 102 is operatively coupled to the control logic 104 and is part of the apparatus 100, such as but not limited to, a television screen, computer monitor, dashboard, head-mounted display, or electronic billboard. The display 102 may be a LCD, OLED display, E-ink display, ELD, billboard display with incandescent lamps, or any other suitable type of display. The control logic 104 may be any suitable hardware, software, firmware, or combination thereof configured to receive display data 106 and render the received display data 106 into control signals 108 for driving the array of subpixels of the display 102. For example, subpixel rendering algorithms for various subpixel arrangements may be part of the control logic 104 or implemented by the control logic 104. The control logic 104 may include any other suitable components, including an encoder, a decoder, one or more processors, controllers (e.g., timing controller), and storage devices. One example of the control logic 104 and a method for rendering subpixels of the display 102 implemented by the control logic 104 are described below in details with reference to FIGS. 16 and 17, respectively.

In one example, the apparatus 100 may be a laptop or desktop computer having a display 102. In this example, the apparatus 100 also includes a processor 110 and memory 112. The processor 110 may be, for example, a graphic processor (e.g., GPU), a general processor (e.g., APU, accelerated processing unit; GPGPU, general-purpose computing on GPU), or any other suitable processor. The memory 112 may be, for example, a discrete frame buffer or a unified memory. The processor 110 is configured to generate display data 106 in display frames and temporally store the display data 106 in the memory 112 before sending it to the control logic 104. The processor 110 may also generate other data, such as but not limited to, control instructions 114 or test signals, and provide them to the control logic 104 directly or through the memory 112. The control logic 104 then receives the display data 106 from the memory 112 or from the processor 110 directly.

In another example, the apparatus 100 may be a television set having a display 102. In this example, the apparatus 100 also includes a receiver 116, such as but not limited to, an antenna, radio frequency receiver, digital signal tuner, digital display connectors, e.g., HDMI, DVI, DisplayPort, USB, Bluetooth, WiFi receiver, or Ethernet port. The receiver 116 is configured to receive the display data 106 as an input of the apparatus 100 and provide the native or modulated display data 106 to the control logic 104.

In still another example, the apparatus 100 may be a handheld device, such as a smart phone or a tablet. In this example, the apparatus 100 includes the processor 110, memory 112, and the receiver 116. The apparatus 100 may both generate display data 106 by its processor 110 and receive display data 106 through its receiver 116. For example, the apparatus 100 may be a handheld device that works as both a portable television and a portable computing device. In any event, the apparatus 100 at least includes the display 102 with specifically designed subpixel arrangements (e.g., zigzag subpixel arrangement) as described below in details and the control logic 104 for the specifically designed subpixel arrangements of the display 102.

Figure 2:
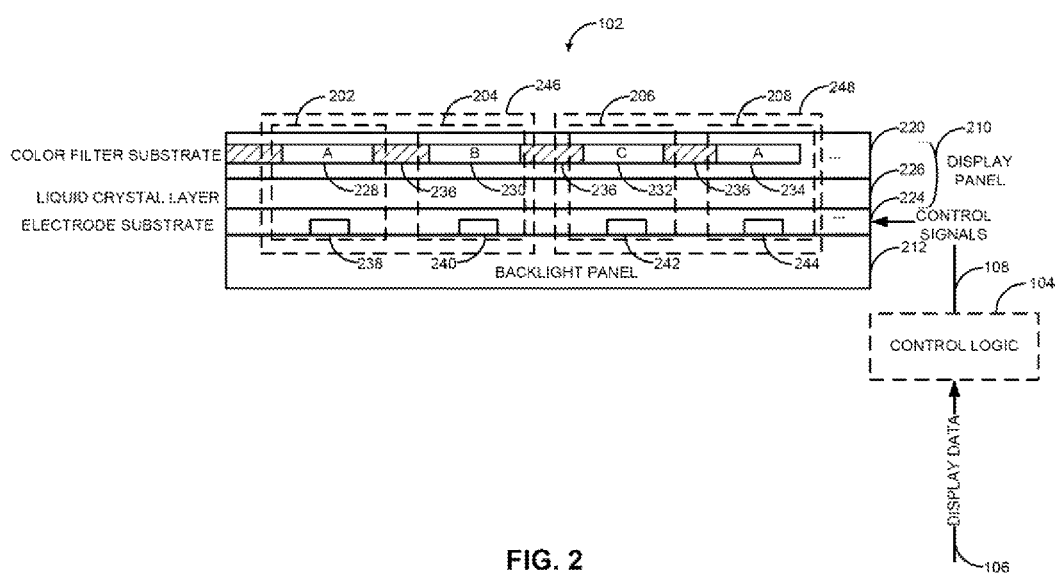
FIG. 2 is a diagram illustrating one example of the display of the apparatus shown in FIG. 1 in accordance with one embodiment set forth in the disclosure.

FIG. 2 illustrates one example of the display 102 including an array of subpixels 202, 204, 206, 208. The display 102 may be any suitable type of display, for example, LCDs, such as a twisted nematic (TN) LCD, in-plane switching (IPS) LCD, advanced fringe field switching (AFFS) LCD, vertical alignment (VA) LCD, advanced super view (ASV) LCD, blue phase mode LCD, passive-matrix (PM) LCD, or any other suitable display. The display 102 may include a display panel 210 and a backlight panel 212, which are operatively coupled to the control logic 104. The backlight panel 212 includes light sources for providing lights to the display panel 210, such as but not limited to incandescent light bulbs, LEDs, EL panel, cold cathode fluorescent lamps (CCFLs), and hot cathode fluorescent lamps (HCFLs), to name a few.

The display panel 210 may be, for example, a TN panel, an IPS panel, an AFFS panel, a VA panel, an ASV panel, or any other suitable display panel. In this example, the display panel 210 includes a color filter substrate 220, an electrode substrate 224, and a liquid crystal layer 226 disposed between the color filter substrate 220 and the electrode substrate 224. As shown in FIG. 2, the color filter substrate 220 includes a plurality of filters 228, 230, 232, 234 corresponding to the plurality of subpixels 202, 204, 206, 208, respectively. A, B, and C in FIG. 2 denote three different colored filters, such as but not limited to, red, green, blue, yellow, cyan, magenta filters, or a white filter. The color filter substrate 220 may also include a black matrix 236 disposed between the filters 228, 230, 232, 234 as shown in FIG. 2. The black matrix 236, as the borders of the subpixels 202, 204, 206, 208, is used for blocking the lights coming out from the parts outside the filters 228, 230, 232, 234. In this example, the electrode substrate 224 includes a plurality of electrodes 238, 240, 242, 244 with switching elements, such as thin film transistors (TFTs), corresponding to the plurality of filters 228, 230, 232, 234 of the plurality of subpixels 202, 204, 206, 208, respectively. The electrodes 238, 240, 242, 244 with the switching elements may be individually addressed by the control signals 108 from the control logic 104 and are configured to drive the corresponding subpixels 202, 204, 206, 208 by controlling the light passing through the respective filters 228, 230, 232, 234 according to the control signals 108. The display panel 210 may include any other suitable component, such as one or more glass substrates, polarization layers, or a touch panel as known in the art.

As shown in FIG. 2, each of the plurality of subpixels 202, 204, 206, 208 is constituted by at least a filter, a corresponding electrode, and the liquid crystal region between the corresponding filter and electrode. The filters 228, 230, 232, 234 may be formed of a resin film in which dyes or pigments having the desired color are contained. Depending on the characteristics (e.g., color, thickness, etc.) of the respective filter, a subpixel may present a distinct color and brightness. In this example, two adjacent subpixels constitute one pixel for display. For example, the subpixels A 202 and B 204 may constitute a pixel 246, and the subpixels C 206 and A 208 may constitute another pixel 248. Here, since the display data 106 is usually programmed at the pixel level, the two subpixels of each pixel or the multiple subpixels of several adjacent pixels may be addressed collectively by subpixel rendering to present the brightness and color of each pixel, as designated in the display data 106, with the help of subpixel rendering. However, it is understood that, in other examples, the display data 106 may be programmed at the subpixel level such that the display data 106 can directly address individual subpixel without the need of subpixel rendering. Because it usually requires three primary colors (red, green, and blue) to present a full color, specifically designed subpixel arrangements are provided below in details for the display 102 to achieve an appropriate apparent color resolution.

Figure 3:
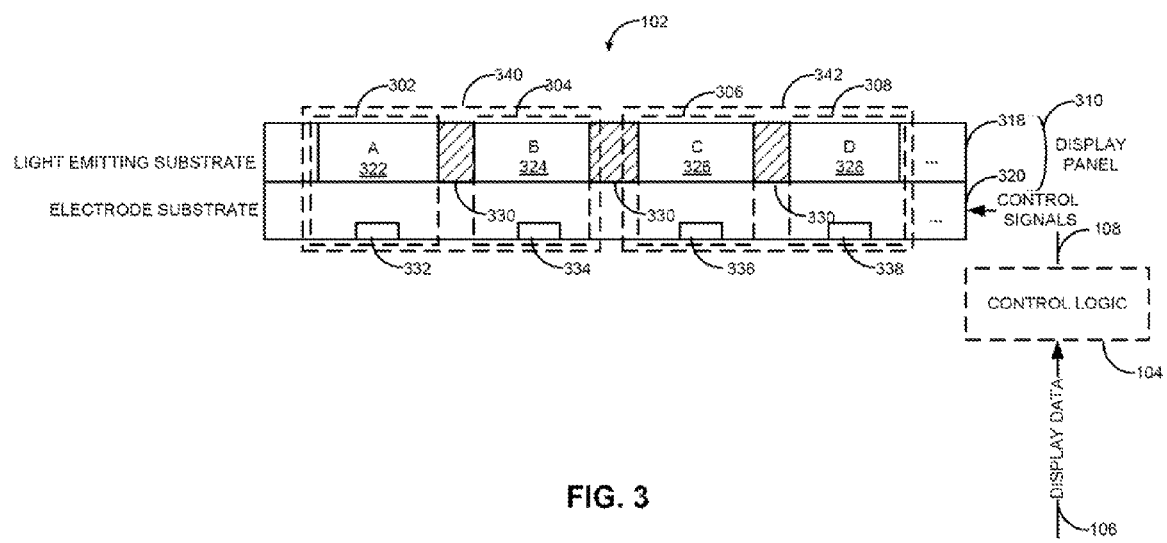
FIG. 3 is a diagram illustrating another example of the display of the apparatus shown in FIG. 1 in accordance with one embodiment set forth in the disclosure.

FIG. 3 illustrates another example of a display 102 including an array of subpixels 302, 304, 306, 308. The display 102 may be any suitable type of display, for example, OLED displays, such as an active-matrix (AM) OLED display, passive-matrix (PM) OLED display, or any other suitable display. The display 102 may include a display panel 310 operatively coupled to the control logic 104. Different from FIG. 2, a backlight panel may not be necessary for an OLED display 102 in FIG. 3 as the display panel 310 can emit lights by the OLEDs therein.

In this example, the display panel 310 includes a light emitting substrate 318 and an electrode substrate 320. As shown in FIG. 3, the light emitting substrate 318 includes a plurality of OLEDs 322, 324, 326, 328 corresponding to the plurality of subpixels 302, 304, 306, 308, respectively. A, B, C, and D in FIG. 3 denote four different colored OLEDs, such as but not limited to, red, green, blue, yellow, cyan, magenta OLEDs, or a white OLED. The light emitting substrate 318 may also include a black matrix 330 disposed between the OLEDs 322, 324, 326, 328 as shown in FIG. 3. The black matrix 330, as the borders of the subpixels 302, 304, 306, 308, is used for blocking the lights coming out from the parts outside the OLEDs 322, 324, 326, 328. Different from FIG. 2, a color filter substrate may not be necessary for an OLED display 102 as each OLED in the light emitting substrate 318 can emit the light with a predetermined color and brightness. In this example, the electrode substrate 320 includes a plurality of electrodes 332, 334, 336, 338 with switching elements, such as TFTs, corresponding to the plurality of OLEDs 322, 324, 326, 328 of the plurality of subpixels 302, 304, 306, 308, respectively. The electrodes 332, 334, 336, 338 with the switching elements may be individually addressed by the control signals 108 from the control logic 104 and are configured to drive the corresponding subpixels 302, 304, 306, 308 by controlling the light emitting from the respective OLEDs 322, 324, 326, 328 according to the control signals 108. The display panel 310 may include any other suitable component, such as one or more glass substrates, polarization layers, or a touch panel as known in the art.

As shown in FIG. 3, each of the plurality of subpixels 302, 304, 306, 308 is constituted by at least an OLED and a corresponding electrode. Each OLED may be formed by a sandwich structure of anode, light emitting layers, and cathode, as known in the art. Depending on the characteristics (e.g., material, structure, etc.) of the light emitting layers of the respective OLED, a subpixel may present a distinct color and brightness. In this example, two adjacent subpixels constitute one pixel for display. For example, the subpixels A 302 and B 304 may constitute a pixel 340, and the subpixels C 306 and D 308 may constitute another pixel 342. Here, since the display data 106 is usually programmed at the pixel level, the two subpixels of each pixel or the multiple subpixels of several adjacent pixels may be addressed collectively by subpixel rendering to present the appropriate brightness and color of each pixel, as designated in the display data 106, with the help of subpixel rendering. However, it is understood that, in other examples, the display data 106 may be programmed at the subpixel level such that the display data 106 can directly address individual subpixel without the need of subpixel rendering. Because it usually requires three primary colors (red, green, and blue) to present a full color, specifically designed subpixel arrangements are provided below in details for the display 102 to achieve an appropriate apparent color resolution.

Although FIGS. 2 and 3 are illustrated as a LCD display and an OLED display, respectively, it is understood that FIGS. 2 and 3 are provided for an exemplary purpose only and without limitations. As noted above, in addition to LCD and OLED display, the display 102 may be an E-ink display, an ELD, a billboard display with incandescent lamps, or any other suitable type of display.

Figures 4A, 4B:
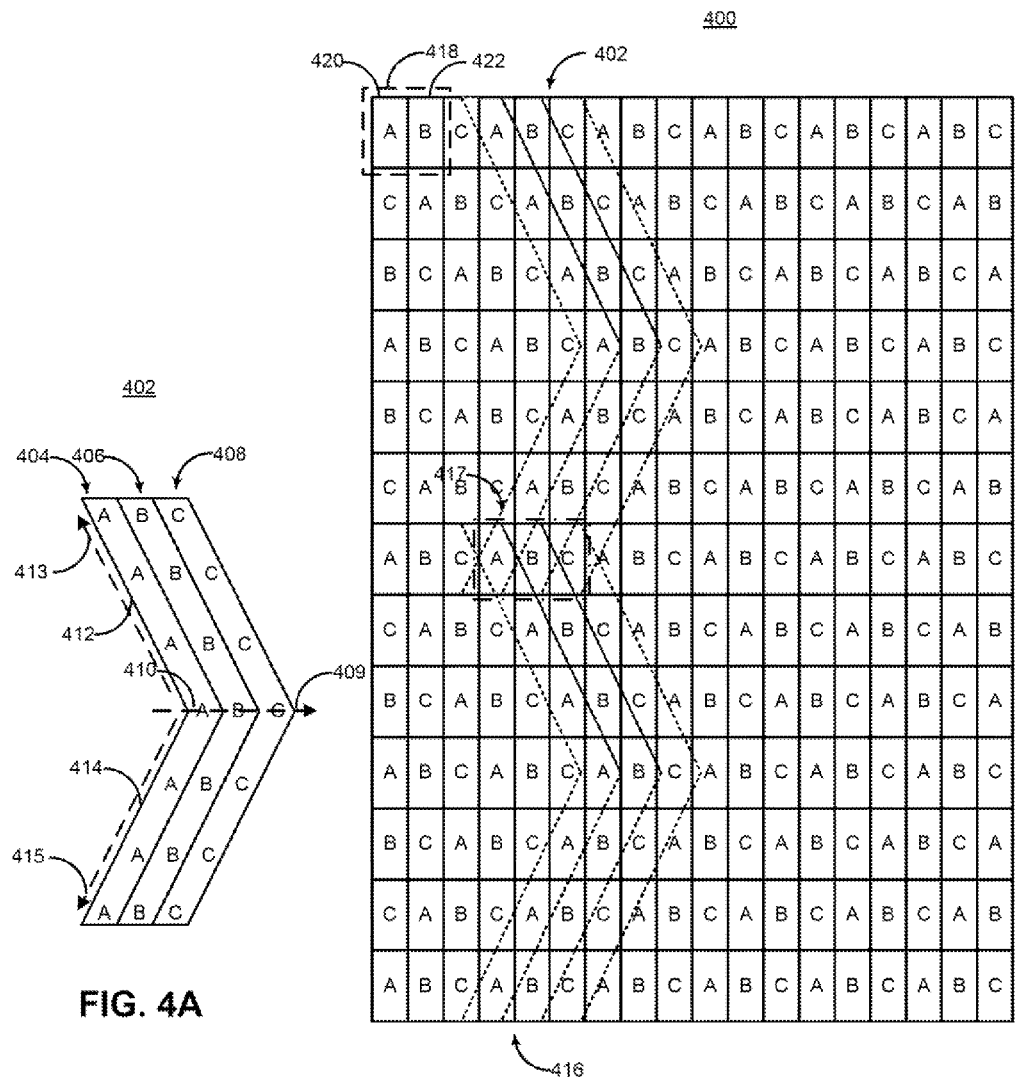
FIG. 4A is a depiction of a zigzag subpixel group in accordance with one embodiment set forth in the disclosure.
FIG. 4B is a depiction of a subpixel arrangement of a display defined by the zigzag subpixel group shown in FIG. 4A.

FIGS. 4A and 4B depict a subpixel arrangement of a display 400 defined by a zigzag subpixel group 402. The display 400 includes an array of subpixels having a plurality of zigzag subpixel groups 402. A, B, and C in FIGS. 4A and 4B denote three different colored subpixels, such as but not limited to, red, green, blue, yellow, cyan, magenta subpixels, or a white subpixel. FIG. 4B may be, for example, a top view of the display 102 and depicts one example of the subpixel arrangements of the display 400. Referring to FIG. 4A, the zigzag subpixel group 402 in this example includes three zigzag subpixel units: a first zigzag subpixel unit 404, a second zigzag subpixel unit 406, and a third zigzag subpixel unit 408. The three zigzag subpixel units 404, 406, 408 are arranged adjacently in the zigzag subpixel group 402 along a horizontal direction 409 of the display 400. Each of the three zigzag subpixel units 404, 406, 408 includes a plurality of subpixels of the same color that are arranged in a zigzag pattern as shown in FIG. 4A. Taking the first zigzag subpixel unit 404 for example, its zigzag pattern has a turning corner where a turning subpixel 410 is located. The turning subpixel 410 thus divides the first zigzag subpixel unit 404 into two parts: a first part having a first plurality of subpixels 412 arranged along one diagonal direction 413 from the turning subpixel 410 and a second part having a second plurality of subpixels 108 arranged along another diagonal direction 415 from the turning subpixel 410. Stated another way, the first zigzag subpixel unit 404 may be described as one subpixel repeating itself from a starting point in a first diagonal direction and then changing its repeating direction to a different diagonal direction at the turning corner. Each subpixel in the first or second part 412, 414 displaces one row and one column from its adjacent subpixel in the respective zigzag subpixel unit. In this example, the plurality of subpixels in each of the three zigzag subpixel units 404, 406, 408 are arranged in a symmetric zigzag pattern such that the number of the first plurality of subpixels in the first part 412 is the same as the number of the second plurality of subpixels in the second part 414. That is, each of the three zigzag subpixel units 404, 406, 408 has seven subpixels, including three subpixels of the first part 412, three subpixels of the second part 414, and one turning subpixel 410.

Referring to FIG. 4B, the subpixel arrangement of the display 400 may be defined by the zigzag subpixel group 402 illustrated in FIG. 4A. In the horizontal direction of the display 400, the subpixel arrangement may be described as the zigzag subpixel groups 402, 416 repeating themselves. In the vertical direction of the display 400, the subpixel arrangement may be described as a plurality of zigzag subpixel groups 402, 416 linked end to end, with their ends overlapped. That is, as shown in FIG. 4B, the bottom row 417 of the zigzag subpixel group 402 is also the top row 417 of another zigzag subpixel group 416.

In this example, all the subpixels of the display 400 have the same shape and size, and two adjacent subpixels constitute one pixel for display. For example, each subpixel may have a substantially rectangular shape with an aspect ratio of about 2:1, as shown in FIG. 4B. In other words, each square pixel 418 is divided horizontally and equally into two rectangular subpixels 420, 422. As can be seen, each pixel of the display 400 may include subpixels with different colors because of the specifically designed subpixel arrangement. For example, the pixel 418 includes a subpixel A and a subpixel B, while another pixel on the right includes a subpixel C and a subpixel A.

Figure 5:
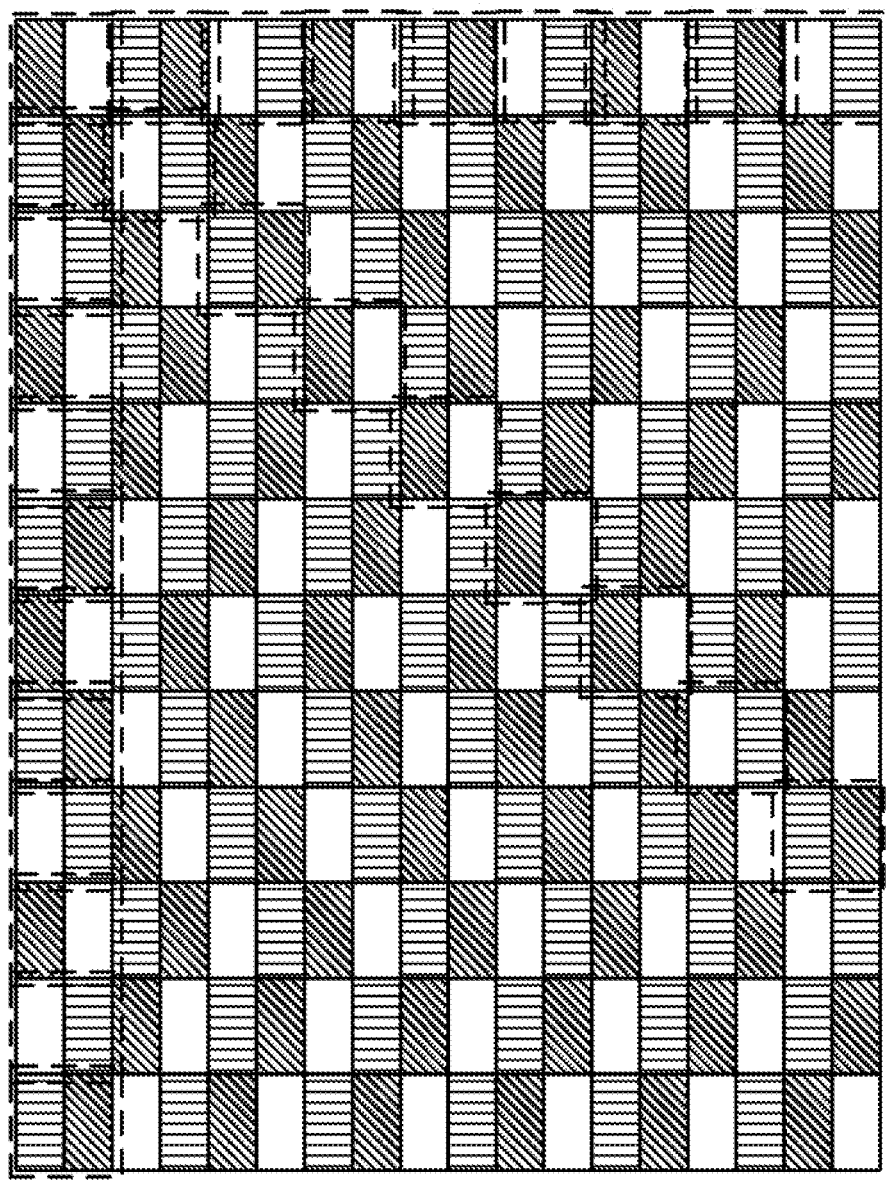
FIG. 5 is a depiction of a red, green, and blue subpixels arrangement of a display defined by the zigzag subpixel group shown in FIG. 4A.
Figure 5:
Figure 5:
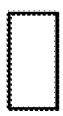
Figure 5:
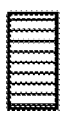

FIG. 5 depicts one example of the subpixel arrangement of the display 400 in FIG. 4B defined by the zigzag subpixel group in FIG. 4A. In this example, the subpixel A is a red subpixel, the subpixel B is a green subpixel, and the subpixel C is a blue subpixel. In the case that the display 400 is a LCD, each colored subpixel may include a color filter. In the case that the display 400 is an OLED display, each colored subpixel may include an OLED emitting colored light. Each dotted area in FIG. 5 represents one pixel that is constituted by two adjacent subpixels. In both the horizontal and vertical directions, the numbers of the red, green, and blue subpixels are evenly distributed, with each colored subpixel having ⅓ of the total number of all subpixels in the respective direction. In addition, as shown in FIG. 5, the specifically designed subpixel arrangement ensures that the pixels along the diagonal direction of the display 400 include subpixels of the three primary colors (red, green, blue). For example, in FIG. 5, the nine pixels in the dotted areas along one diagonal direction of the display 400 include seven red subpixels, seven green subpixels, and four blue subpixels. Thus, the color resolution in the diagonal direction of this subpixel arrangement is improved compared with the known solutions as noted above. In this example, all the subpixels of the display 400 are colored subpixels without any white subpixel. Thus, the color saturation of the subpixel arrangement in this example is improved compared with some known solutions that use white subpixels.

Figures 6A, 6B:
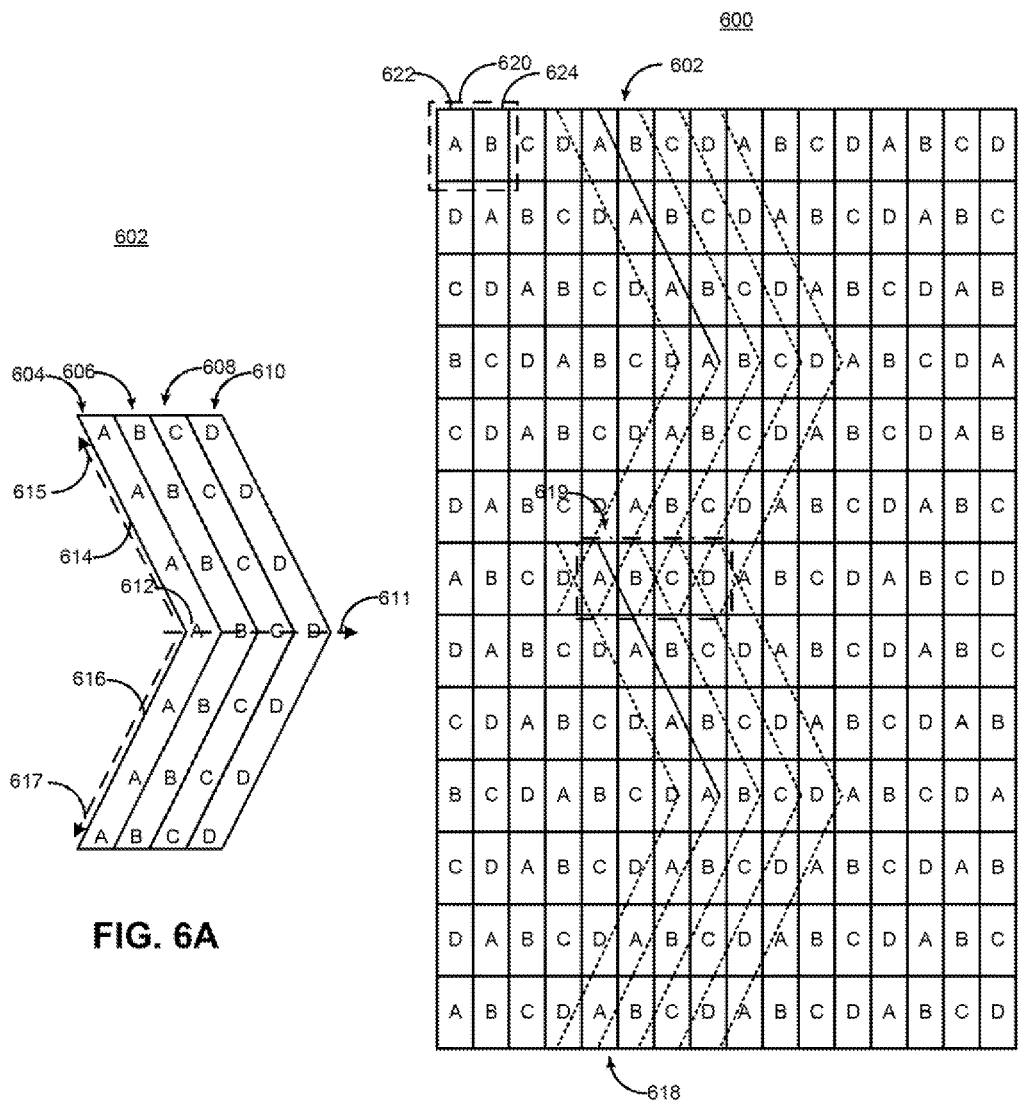
FIG. 6A is a depiction of another zigzag subpixel group in accordance with one embodiment set forth in the disclosure.
FIG. 6B is a depiction of a subpixel arrangement of a display defined by the zigzag subpixel group shown in FIG. 6A.

FIGS. 6A and 6B depict another subpixel arrangement of a display 600 defined by a zigzag subpixel group 602. The display 600 includes an array of subpixels having a plurality of zigzag subpixel groups 602. A, B, C, and D in FIGS. 6A and 6B denote four different colored subpixels, such as but not limited to, red, green, blue, yellow, cyan, magenta subpixels, or a white subpixel. FIG. 6B may be, for example, a top view of the display 102 and depicts one example of the subpixel arrangements of the display 600. Referring to FIG. 6A, the zigzag subpixel group 602 in this example includes four zigzag subpixel units: a first zigzag subpixel unit 604, a second zigzag subpixel unit 606, a third zigzag subpixel unit 608, and a fourth zigzag subpixel unit 610. It is understood that the number of the zigzag subpixel units in each zigzag subpixel group is the same as the number of subpixel colors, which is three in FIGS. 4A and 4B, four in FIGS. 6A and 6B, and may be five or more in other examples. In this example, the four zigzag subpixel units 604, 606, 608, 610 are arranged adjacently in the zigzag subpixel group 602 along a horizontal direction 611 of the display 600. Each of the four zigzag subpixel units 604, 606, 608, 610 includes a plurality of subpixels of the same color that are arranged in a zigzag pattern as shown in FIG. 6A. Taking the first zigzag subpixel unit 604 for example, its zigzag pattern has a turning corner where a turning subpixel 612 is located. The turning subpixel 612 thus divides the first zigzag subpixel unit 604 into two parts: a first part having a first plurality of subpixels 614 arranged along one diagonal direction 615 from the turning subpixel 612 and a second part having a second plurality of subpixels 616 arranged along another diagonal direction 617 from the turning subpixel 612. Stated another way, the first zigzag subpixel unit 604 may be described as one subpixel repeating itself from a starting point in a first diagonal direction and then changing its repeating direction to a different diagonal direction at the turning corner. Each subpixel in the first or second part 614, 616 displaces one row and one column from its adjacent subpixel in the respective zigzag subpixel unit. In this example, the plurality of subpixels in each of the four zigzag subpixel units 604, 606, 608, 610 are arranged in a symmetric zigzag pattern such that the number of the first plurality of subpixels in the first part 614 is the same as the number of the second plurality of subpixels in the second part 616. That is, each of the four zigzag subpixel units 604, 606, 608, 610 has seven subpixels, including three subpixels of the first part 614, three subpixels of the second part 616, and one turning subpixel 612.

Referring to FIG. 6B, the subpixel arrangement of the display 600 may be defined by the zigzag subpixel group 602 illustrated in FIG. 6A. In the horizontal direction of the display 600, the subpixel arrangement may be described as the zigzag subpixel groups 602, 618 repeating themselves. In the vertical direction of the display 600, the subpixel arrangement may be described as a plurality of zigzag subpixel groups 602, 618 linked end to end, with their ends overlapped. That is, as shown in FIG. 6B, the bottom row 619 of the zigzag subpixel group 602 is also the top row 619 of another zigzag subpixel group 618.

In this example, all the subpixels of the display 600 have the same shape and size, and two adjacent subpixels constitute one pixel for display. For example, each subpixel may have a substantially rectangular shape with an aspect ratio of about 2:1, as shown in FIG. 6B. In other words, each square pixel 620 is divided horizontally and equally into two rectangular subpixels 622, 624. As can be seen, each pixel of the display 600 may include subpixels with different colors because of the specifically designed subpixel arrangement. For example, the pixel 620 includes a subpixel A and a subpixel B, while another pixel on the right includes a subpixel C and a subpixel D.

Figure 7:
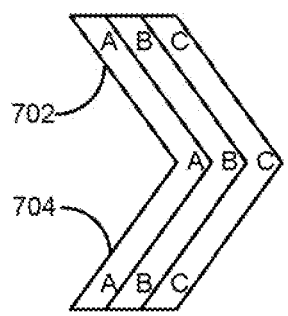
FIG. 7 is a depiction of still another zigzag subpixel group in accordance with one embodiment set forth in the disclosure.
Figure 8:
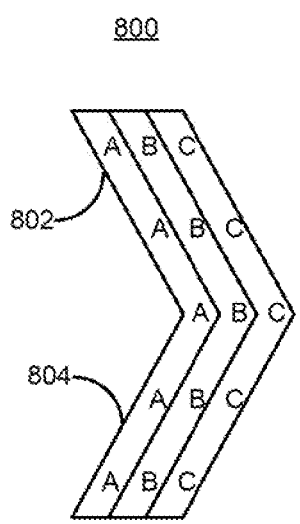
FIG. 8 is a depiction of yet another zigzag subpixel group in accordance with one embodiment set forth in the disclosure.

As noted above, the number of subpixels in the first and second parts of a zigzag subpixel group (i.e., the size of the symmetric zigzag pattern) may vary from one to the vertical resolution of the display in different examples. FIG. 7 depicts a zigzag subpixel group 700 with the number of subpixels in the first and second parts 702, 704 equal to one. FIG. 8 depicts another zigzag subpixel group 800 with the number of subpixels in the first and second parts 802, 804 equal to two.

Figures 9A, 9B:
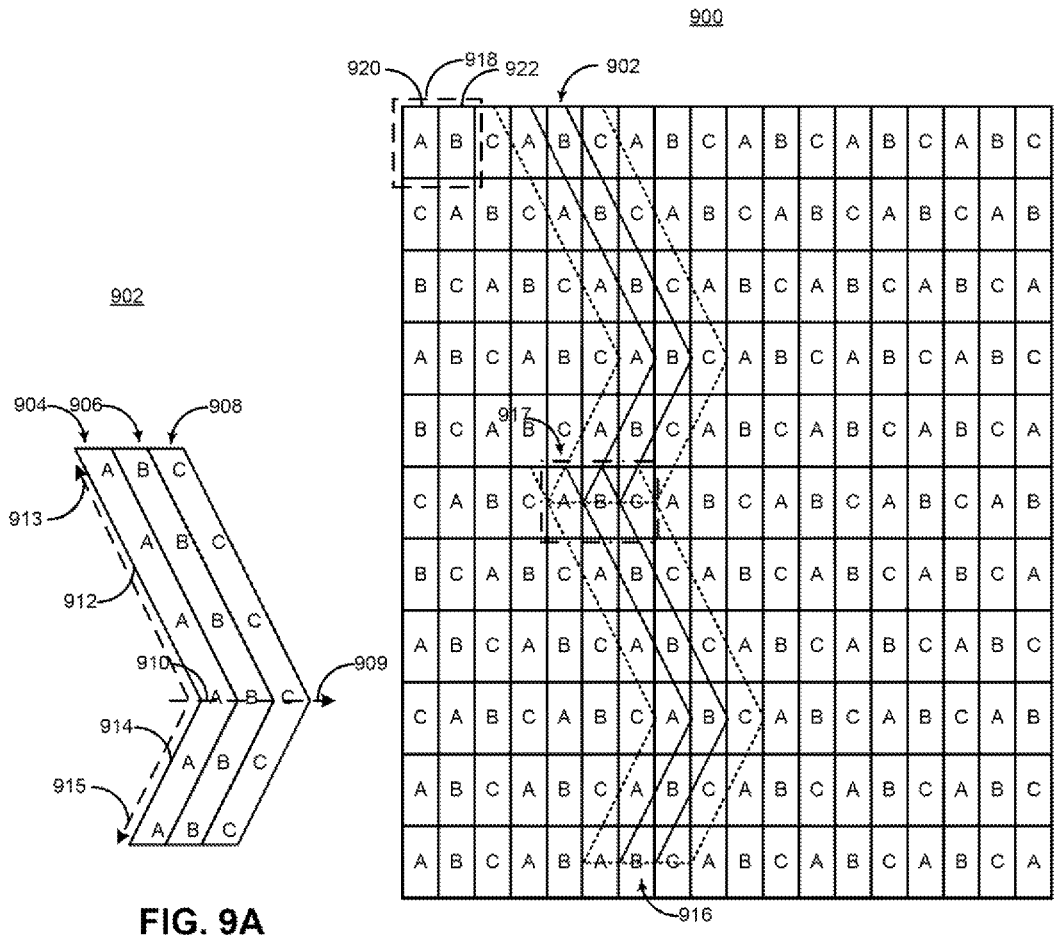
FIG. 9A is a depiction of yet another zigzag subpixel group in accordance with one embodiment set forth in the disclosure.
FIG. 9B is a depiction of a subpixel arrangement of a display defined by the zigzag subpixel group shown in FIG. 9A.

FIGS. 9A and 9B depict still another subpixel arrangement of a display 900 defined by a zigzag subpixel group 902. The display 900 includes an array of subpixels having a plurality of zigzag subpixel groups 902. A, B, and C in FIGS. 9A and 9B denote three different colored subpixels, such as but not limited to, red, green, blue, yellow, cyan, magenta subpixels, or a white subpixel. FIG. 9B may be, for example, a top view of the display 102 and depicts one example of the subpixel arrangements of the display 900. Referring to FIG. 9A, the zigzag subpixel group 902 in this example includes three zigzag subpixel units: a first zigzag subpixel unit 904, a second zigzag subpixel unit 906, and a third zigzag subpixel unit 908. The three zigzag subpixel units 904, 906, 908 are arranged adjacently in the zigzag subpixel group 902 along a horizontal direction 909 of the display 900. Each of the three zigzag subpixel units 904, 906, 908 includes a plurality of subpixels of the same color that are arranged in a zigzag pattern, as shown in FIG. 9A. Taking the first zigzag subpixel unit 904 for example, its zigzag pattern has a turning corner where a turning subpixel 910 is located. The turning subpixel 910 thus divides the first zigzag subpixel unit 904 into two parts: a first part having a first plurality of subpixels 912 arranged along one diagonal direction 913 from the turning subpixel 910 and a second part having a second plurality of subpixels 914 arranged along another diagonal direction 915 from the turning subpixel 910. Stated another way, the first zigzag subpixel unit 904 may be described as one subpixel repeating itself from a starting point in a first diagonal direction and then changing its repeating direction to a different diagonal direction at the turning corner. Each subpixel in the first or second part 912, 914 displaces one row and one column from its adjacent subpixel in the respective zigzag subpixel unit. Different from the examples in FIGS. 4-8, in this example, the plurality of subpixels in each of the three zigzag subpixel units 904, 906, 908 are arranged in an asymmetric zigzag pattern such that the number of the first plurality of subpixels in the first part 912 is different from the number of the second plurality of subpixels in the second part 914. In this example, the number of the first plurality of subpixels in the first part 912 is three, while the number of the second plurality of subpixels in the second part 914 is two. It is understood that the number of subpixels in the first and/or second part of an asymmetric zigzag pattern may vary in other examples.

Referring to FIG. 9B, the subpixel arrangement of the display 900 may be defined by the zigzag subpixel group 902 illustrated in FIG. 9A. In the horizontal direction of the display 900, the subpixel arrangement may be described as the zigzag subpixel groups 902, 916 repeating themselves. In the vertical direction of the display 900, the subpixel arrangement may be described as a plurality of zigzag subpixel groups 902, 916 linked end to end, with their ends overlapped. That is, as shown in FIG. 9B, the bottom row 917 of the zigzag subpixel group 902 is also the top row 917 of another zigzag subpixel group 916.

In this example, all the subpixels of the display 900 have the same shape and size, and two adjacent subpixels constitute one pixel for display. For example, each subpixel may have a substantially rectangular shape with an aspect ratio of about 2:1, as shown in FIG. 9B. In other words, each square pixel 918 is divided horizontally and equally into two rectangular subpixels 920, 922. As can be seen, each pixel of the display 900 may include subpixels with different colors because of the specifically designed subpixel arrangement. For example, the pixel 918 includes a subpixel A and a subpixel B, while another pixel on the right includes a subpixel C and a subpixel A.

Figure 10:
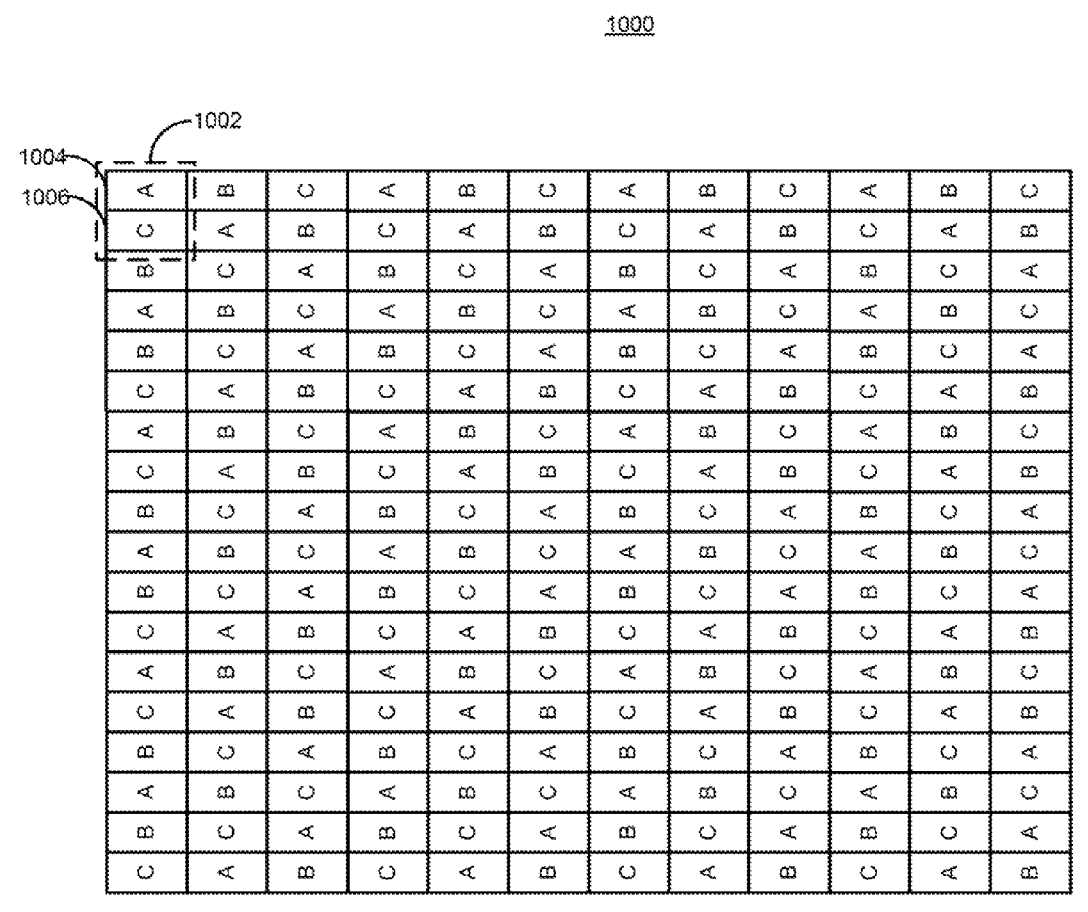

All the subpixels in FIGS. 4-9 have substantially rectangular shapes with an aspect ratio of about 2:1. That is, each square pixel is divided horizontally and equally into two rectangular subpixels. However, it is understood that each square pixel may be divided differently in other examples. For example, FIG. 10 depicts another subpixel arrangement of a display 1000 defined by the zigzag subpixel group 402 in FIG. 4A. Different from FIG. 4B, each subpixel in this example has a substantially rectangular shape with an aspect ratio of about 1:2. In other words, each square pixel 1002 is divided vertically and equally into two rectangular subpixels 1004, 1006.

Figure 11A:
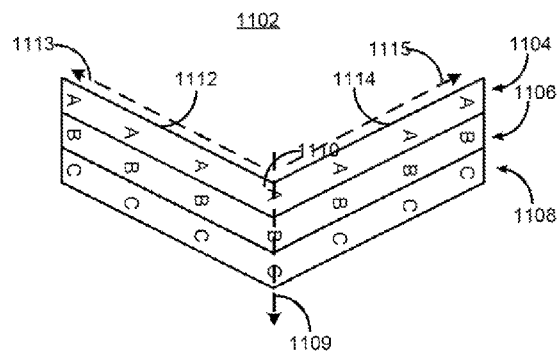
FIG. 11A is a depiction of yet another zigzag subpixel group in accordance with one embodiment set forth in the disclosure.
Figure 11B:
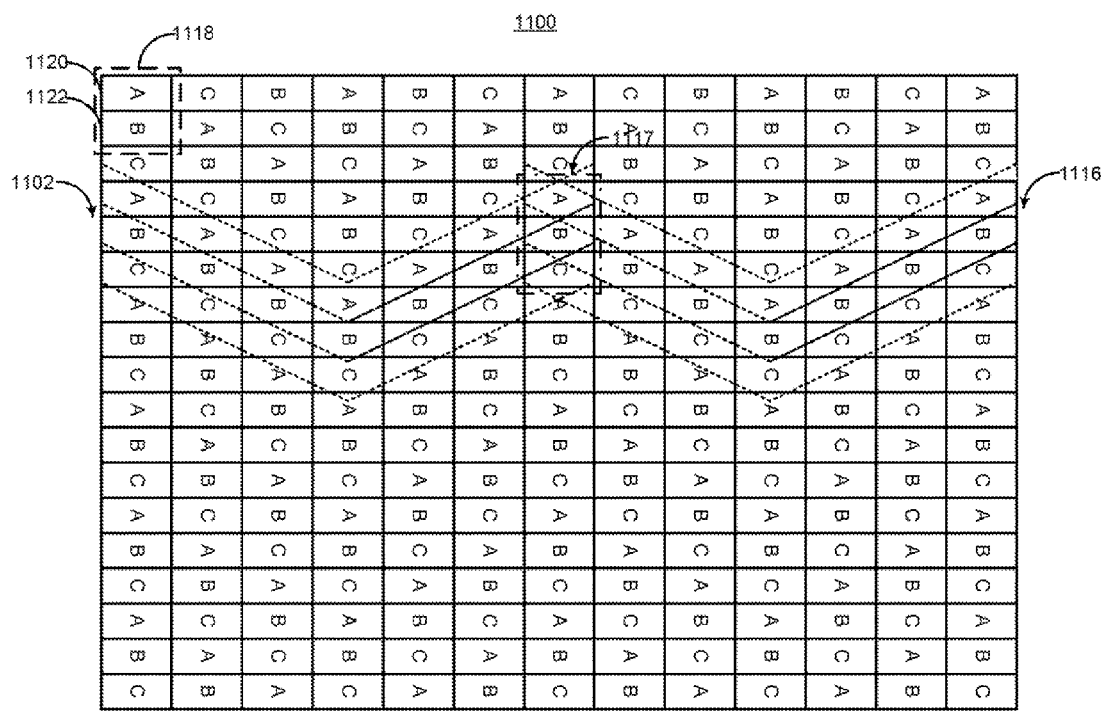
FIG. 11B is a depiction of a subpixel arrangement of a display defined by the zigzag subpixel group shown in FIG. 11A.

FIGS. 11A and 11B depict still another subpixel arrangement of a display 1100 defined by a zigzag subpixel group 1102. The display 1100 includes an array of subpixels having a plurality of zigzag subpixel groups 1102. A, B, and C in FIGS. 11A and 11B denote three different colored subpixels, such as but not limited to, red, green, blue, yellow, cyan, magenta subpixels, or a white subpixel. FIG. 11B may be, for example, a top view of the display 102 and depicts one example of the subpixel arrangements of the display 1100. Referring to FIG. 11A, the zigzag subpixel group 1102 in this example includes three zigzag subpixel units: a first zigzag subpixel unit 1104, a second zigzag subpixel unit 1106, and a third zigzag subpixel unit 1108. Different from the examples in FIGS. 4-10, the three zigzag subpixel units 1104, 1106, 1108 in this example are arranged adjacently in the zigzag subpixel group 1102 along a vertical direction 1109 of the display 1100 instead of a horizontal direction. In other words, the zigzag subpixel group 1102 is the 90 degree rotation transformation of the zigzag subpixel group 402 in FIG. 4A. Each of the three zigzag subpixel units 1104, 1106, 1108 includes a plurality of subpixels of the same color that are arranged in a zigzag pattern as shown in FIG. 11A. Taking the first zigzag subpixel unit 1104 for example, its zigzag pattern has a turning corner where a turning subpixel 1110 is located. The turning subpixel 1110 thus divides the first zigzag subpixel unit 1104 into two parts: a first part having a first plurality of subpixels 1112 arranged along one diagonal direction 1113 from the turning subpixel 1110 and a second part having a second plurality of subpixels 1114 arranged along another diagonal direction 1115 from the turning subpixel 1110. Stated another way, the first zigzag subpixel unit 1104 may be described as one subpixel repeating itself from a starting point in a first diagonal direction and then changing its repeating direction to a different diagonal direction at the turning corner. Each subpixel in the first or second part 1112, 1114 displaces one column and one row from its adjacent subpixel in the respective zigzag subpixel unit. In this example, the plurality of subpixels in each of the three zigzag subpixel units 1104, 1106, 1108 are arranged in a symmetric zigzag pattern such that the number of the first plurality of subpixels in the first part 1112 is the same as the number of the second plurality of subpixels in the second part 1114. That is, each of the three zigzag subpixel units 1104, 1106, 1108 has seven subpixels, including three subpixels of the first part 1112, three subpixels of the second part 1114, and one turning subpixel 1110.

Referring to FIG. 11B, the subpixel arrangement of the display 1100 may be defined by the zigzag subpixel group 1102 illustrated in FIG. 11A. In the vertical direction of the display 1100, the subpixel arrangement may be described as the zigzag subpixel groups 1102, 1116 repeating themselves. In the horizontal direction of the display 1100, the subpixel arrangement may be described as a plurality of zigzag subpixel groups 1102, 1116 linked end to end, with their ends overlapped. That is, as shown in FIG. 11B, the right-most column 1117 of the zigzag subpixel group 1102 is also the left-most column 1117 of another zigzag subpixel group 1116.

In this example, all the subpixels of the display 1100 have the same shape and size, and two adjacent subpixels constitute one pixel for display. For example, each subpixel may have a substantially rectangular shape with an aspect ratio of about 1:2, as shown in FIG. 11B. In other words, each square pixel 1118 is divided vertically and equally into two rectangular subpixels 1120, 1122. As can be seen, each pixel of the display 1100 may include subpixels with different colors because of the specifically designed subpixel arrangement. For example, the pixel 1118 includes a subpixel A and a subpixel B, while another pixel on the right includes a subpixel C and a subpixel A.

Figures 12A, 12B:
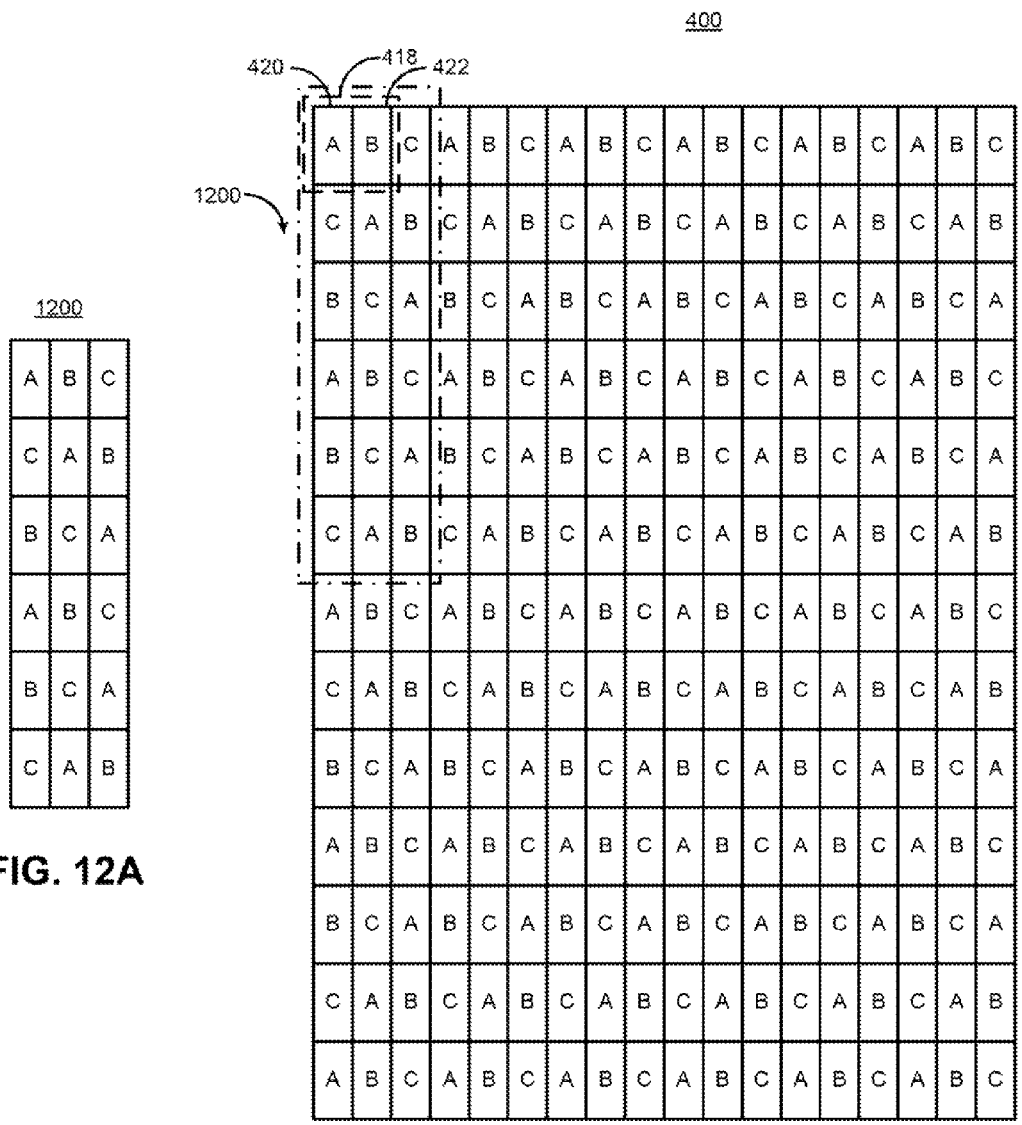
FIG. 12A is a depiction of a subpixel repeating group in accordance with one embodiment set forth in the disclosure.
FIG. 12B is a depiction of a subpixel arrangement of a display defined by the subpixel repeating group shown in FIG. 12A.

The subpixel arrangements of displays may be defined in other manners in addition to being defined by a zigzag subpixel group as described in FIGS. 4-11. FIGS. 12A and 12B depict the subpixel arrangement of the display 400 defined by a subpixel repeating group 1200. The display 400 includes an array of subpixels having a plurality of subpixel repeating groups 1200. FIG. 12B may be, for example, a top view of the display 102 and depicts another example of the subpixel arrangements of the display 400. Referring to FIG. 12A, the subpixel repeating group 1200 has a pattern:

| A | B | C |
| C | A | B |
| B | C | A |
| A | B | C |
| B | C | A |
| C | A | B, | where, A, B, and C denote three different colored subpixels, such as but not limited to, red, green, blue, yellow, cyan, magenta subpixels, or a white subpixel.

Referring to FIG. 12B, the subpixel arrangement of the display 400 may be defined by the subpixel repeating group 1200 illustrated in FIG. 12A. The display 400 includes a plurality of subpixel repeating groups 1200 tiled across the display 400 in a regular pattern. In other words, the subpixel arrangement may be described as the subpixel repeating group 1200 repeating itself along both the horizontal and vertical directions of the display 400.

In this example, all the subpixels on the display 400 have the same shape and size, and two adjacent subpixels constitute one pixel for display. For example, each subpixel has a substantially rectangular shape with an aspect ratio of about 2:1, as shown in FIG. 12B. In other words, each square pixel 418 is divided horizontally and equally into two rectangular subpixels 420, 422. As can be seen, each pixel of the display 400 may include subpixels with different colors because of the specifically designed subpixel arrangement. For example, the pixel 418 includes a subpixel A and a subpixel B, while another pixel on the right includes a subpixel C and a subpixel A.

Figures 13A, 13B:
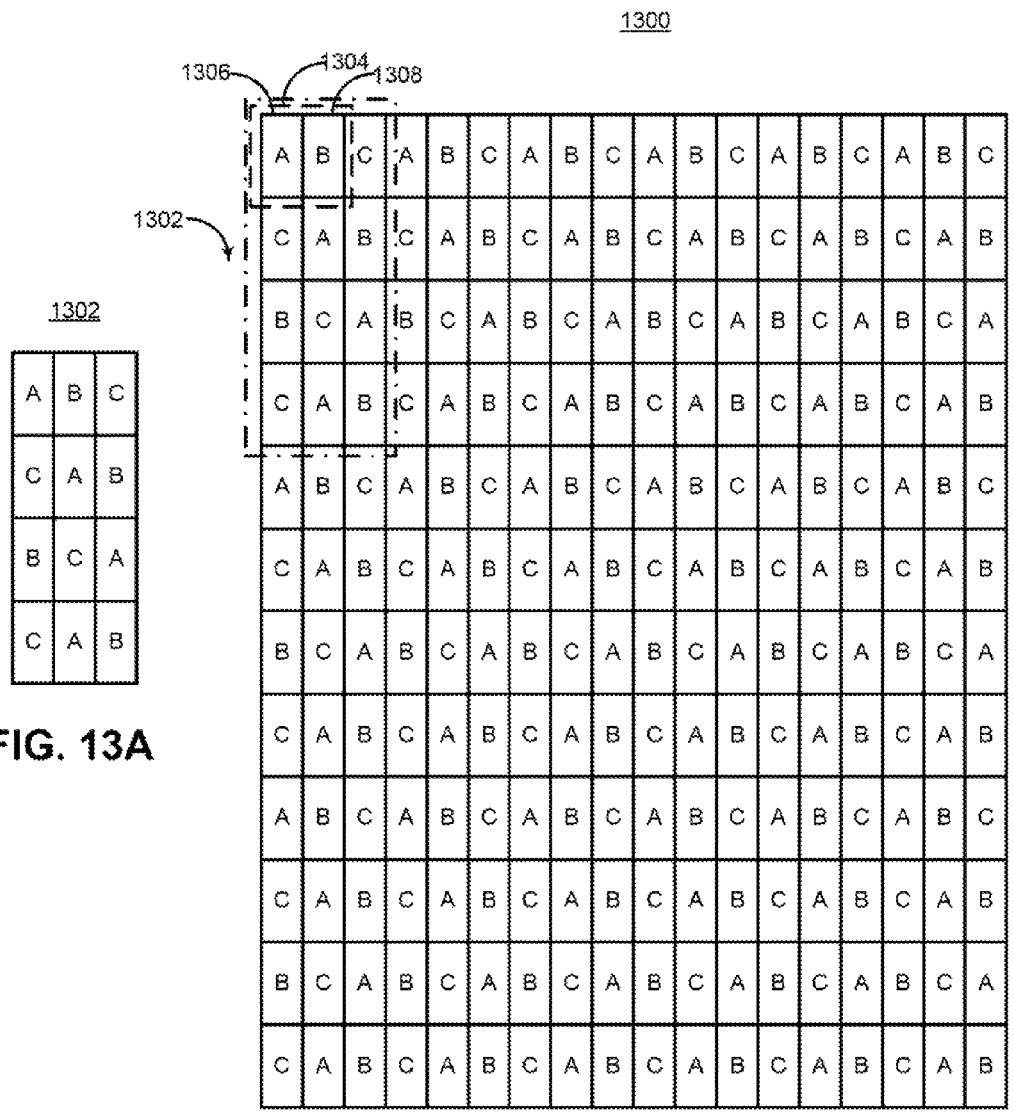
FIG. 13A is a depiction of another subpixel repeating group in accordance with one embodiment set forth in the disclosure.
FIG. 13B is a depiction of a subpixel arrangement of a display defined by the subpixel repeating group shown in FIG. 13A.

FIGS. 13A and 13B depict yet another subpixel arrangement of a display 1300 defined by a subpixel repeating group 1302. The display 1300 includes an array of subpixels having a plurality of subpixel repeating groups 1302. FIG. 13B may be, for example, a top view of the display 102 and depicts one example of the subpixel arrangements of the display 1300. Referring to FIG. 13A, the subpixel repeating group 1302 has a pattern:

| A | B | C |
| C | A | B |
| B | C | A |
| C | A | B, | where, A, B, and C denote three different colored subpixels, such as but not limited to, red, green, blue, yellow, cyan, magenta subpixels, or a white subpixel.

Referring to FIG. 13B, the subpixel arrangement of the display 1300 may be defined by the subpixel repeating group 1302 illustrated in FIG. 13A. The display 1300 includes a plurality of subpixel repeating groups 1302 tiled across the display 1300 in a regular pattern. In other words, the subpixel arrangement may be described as the subpixel repeating group 1302 repeating itself along both the horizontal and vertical directions of the display 1300.

In this example, all the subpixels on the display 1300 have the same shape and size, and two adjacent subpixels constitute one pixel for display. For example, each subpixel has a substantially rectangular shape with an aspect ratio of about 2:1, as shown in FIG. 13B. In other words, each square pixel 1304 is divided horizontally and equally into two rectangular subpixels 1306, 1308. As can be seen, each pixel of the display 1300 may include subpixels with different colors because of the specifically designed subpixel arrangement. For example, the pixel 1304 includes a subpixel A and a subpixel B, while another pixel on the right includes a subpixel C and a subpixel A.

Figures 14A, 14B:
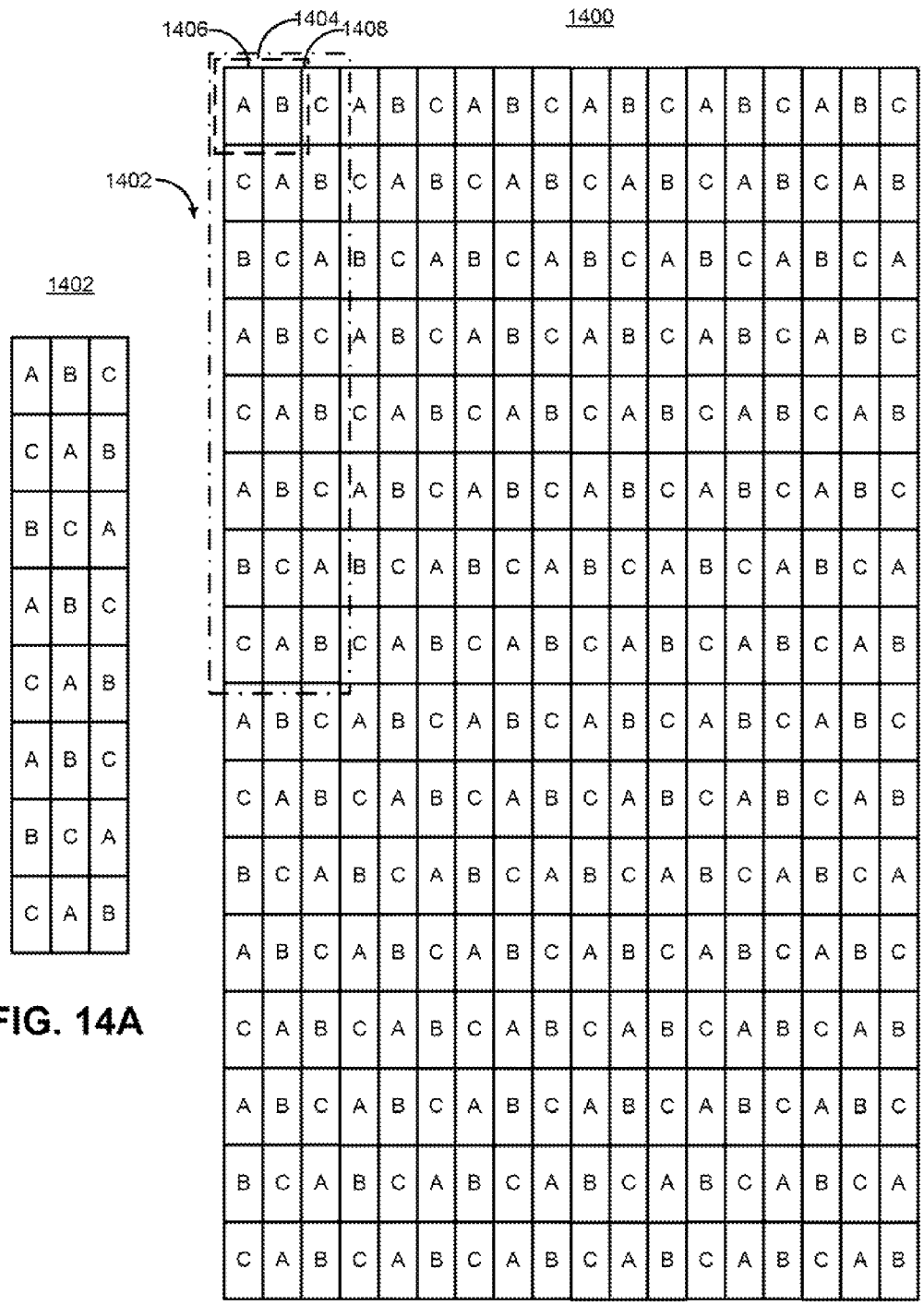
FIG. 14A is a depiction of still another subpixel repeating group in accordance with one embodiment set forth in the disclosure.
FIG. 14B is a depiction of a subpixel arrangement of a display defined by the subpixel repeating group shown in FIG. 14A.

FIGS. 14A and 14B depict yet another subpixel arrangement of a display 1400 defined by a subpixel repeating group 1402. The display 1400 includes an array of subpixels having a plurality of subpixel repeating groups 1402. FIG. 14B may be, for example, a top view of the display 102 and depicts one example of the subpixel arrangements of the display 1400. Referring to FIG. 14A, the subpixel repeating group 1402 has a pattern:

| A | B | C |
| C | A | B |
| B | C | A |
| A | B | C |
| C | A | B |
| A | B | C |
| B | C | A |
| C | A | B, | where, A, B, and C denote three different colored subpixels, such as but not limited to, red, green, blue, yellow, cyan, magenta subpixels, or a white subpixel.

Referring to FIG. 14B, the subpixel arrangement of the display 1400 may be defined by the subpixel repeating group 1402 illustrated in FIG. 14A. The display 1400 includes a plurality of subpixel repeating groups 1402 tiled across the display 1400 in a regular pattern. In other words, the subpixel arrangement may be described as the subpixel repeating group 1402 repeating itself along both the horizontal and vertical directions of the display 1400.

In this example, all the subpixels on the display 1400 have the same shape and size, and two adjacent subpixels constitute one pixel for display. For example, each subpixel has a substantially rectangular shape with an aspect ratio of about 2:1, as shown in FIG. 14B. In other words, each square pixel 1404 is divided horizontally and equally into two rectangular subpixels 1406, 1408. As can be seen, each pixel of the display 1400 may include subpixels with different colors because of the specifically designed subpixel arrangement. For example, the pixel 1404 includes a subpixel A and a subpixel B, while another pixel on the right includes a subpixel C and a subpixel A.

Figure 15:
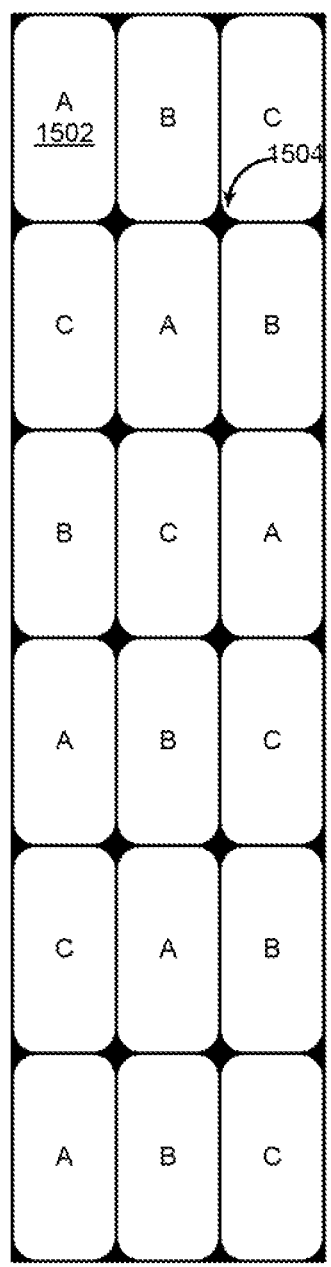
FIG. 15 is a depiction of yet another subpixel repeating group in accordance with one embodiment set forth in the disclosure.

In the examples of FIGS. 4-14, each subpixel has a substantially rectangular shape. However, it is understood that the shape of each subpixel in other examples may vary. For example, FIG. 15 depicts one example of a subpixel repeating group 1500 having subpixels in a substantially rectangular shape with curved corners. Other shapes of the subpixels include, but are not limited to, substantially round, triangle, pentagon, hexagon, heptagon, octagon, or any other suitable shape. The regions between the subpixels 1502 may be filled with the black matrix 1504 as noted above.

Figure 16:
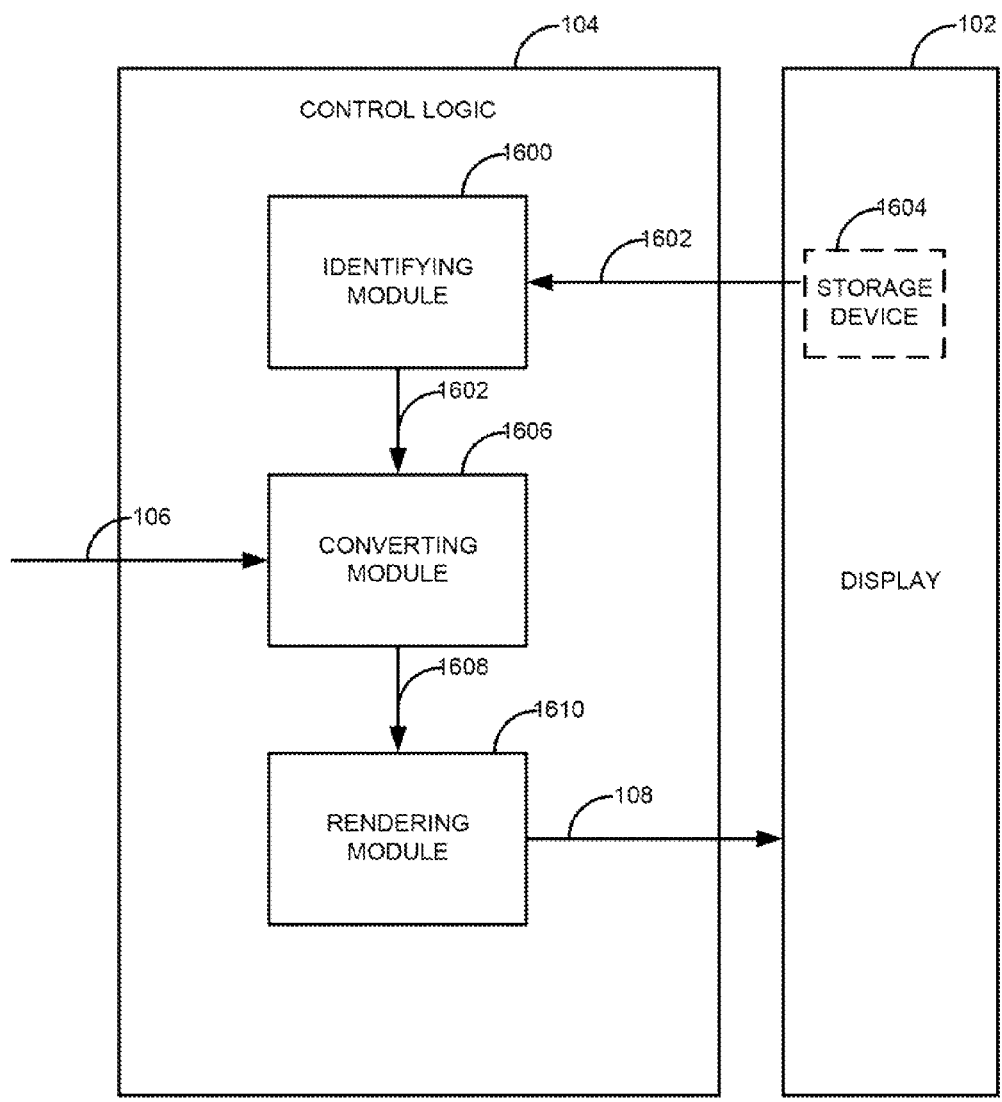
FIG. 16 is a block diagram illustrating one example of the control logic of the apparatus shown in FIG. 1 in accordance with one embodiment set forth in the disclosure.

FIG. 16 depicts one example of the control logic 104 of the apparatus 100 for rendering subpixels of the display 102 with the subpixel arrangements provided above. The "logic" and "module" referred to herein are defined as any suitable software, hardware, firmware, or any suitable combination thereof that can perform the desired function, such as programmed processors, discrete logic, for example, state machine, to name a few. In this example, the control logic 104 includes an identifying module 1600 configured to identify the subpixel arrangement 1602 of the display 102, such as any one of the subpixel arrangements provided above or any other suitable subpixel arrangement in accordance with the present disclosure. In this example, a storage device 1604, for example a ROM as part of the display 102, stores the information regarding the subpixel arrangement 1602 of the display 102. The identifying module 1600 thus obtains the information regarding the subpixel arrangement 1602 from the storage device 1604. In another example, the storage device 1604 is not part of the display 102, but part of the control logic 104 or any other suitable component of the apparatus 100. In still another example, the storage device 1604 is outside the apparatus 100, and the identifying module 1600 may load the information of the subpixel arrangement 1602 of the display 102 from, for example, a remote database.

The control logic 104 in FIG. 16 also includes a converting module 1606 operatively coupled to the identifying module 1600. The converting module 1606 is configured to convert the received display data 106 from the processor 110, memory 112, and/or the receiver 116 into a converted display data 1608 based on the identified subpixel arrangement 1602 of the display 102. As noted above, the display data 106 may be programmed at the pixel level and thus includes three parts of data for rendering three subpixels with different colors (e.g., three primary colors of red, green, and blue) for each pixel of the display 102. In one example, the converting module 1606 identifies, for each pixel of the display 102, one of the three parts of data that represents a color of subpixel other than the corresponding two adjacent subpixels constituting the respective pixel. That is, for the display data 106 programmed on a basis of three or more subpixels constituting one pixel, the converting module 1606 identifies one or more types of subpixels that are missing from a corresponding pixel in the subpixel arrangement 1602 of the display 102. In this example, the converting module 1606 then removes the identified part of data from the display data 106 for each pixel to generate the converted display data 1608. The converted display data 1608 thus includes two parts of data for each pixel for rendering the corresponding two adjacent subpixels constituting the respective pixel. For example, the first pixel 418 of the display 400 in FIG. 4B (i.e., the pixel in the first row and first column) is constituted by two subpixels A 420 and B 422. This information is part of the subpixel arrangement 1602 and is received by the converting module 1606. The converting module 1606 may also receive display data 106 in which the data for rendering the first pixel 418 includes three parts of data representing subpixels A, B, and C, respectively. Accordingly, the converting module 1606 identifies that subpixel C is missing from the pixel 418 and thus, removes the part of data representing subpixel C from the display data 106. The converting module 1606 repeats this process for all the pixels of the display 102 and generates the converted display data 1608 for the specifically designed subpixel arrangement 1602 of the display 102.

The control logic 104 in FIG. 16 also includes a rendering module 1610 operatively coupled to the converting module 1606. The rendering module 1610 is configured to provide the control signals 108 for rendering the array of subpixels of the display 102 based on the converted display data 1608. As noted above, for example, the control signals 108 may control the state of each individual subpixel of the display 102 by voltage and/or current signals in accordance with the converted display data 1608.

Figure 17:
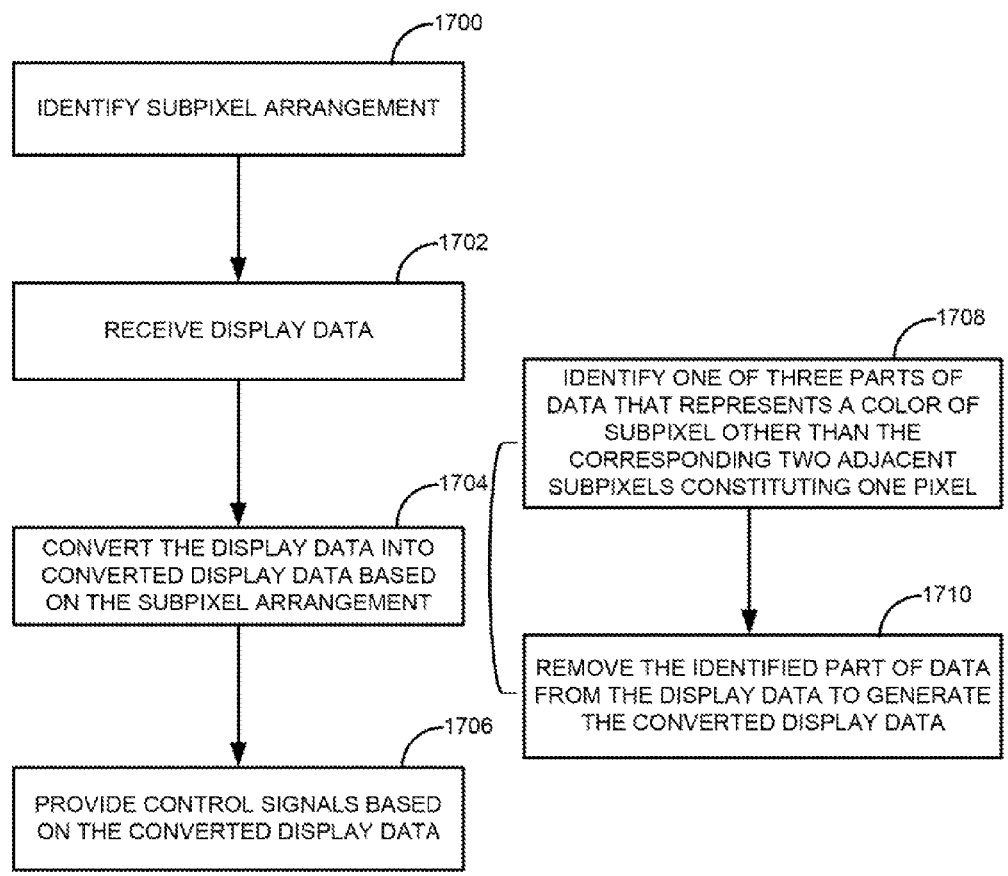
FIG. 17 is a flow chart illustrating a method for rendering subpixels of the display of the apparatus shown in FIG. 1 in accordance with one embodiment set forth in the disclosure.

FIG. 17 depicts one example of a method for rendering subpixels of a display 102. The method may be implemented by the control logic 104 of the apparatus 100 or on any other suitable machine having at least one processor. Beginning at block 1700, an arrangement of an array of subpixels of the display 102 is identified. As descried above, block 1700 may be performed by the identifying module 1600 of the control logic 104. At block 1702, display data including, for each pixel for display, three parts of data for rendering three subpixels with different colors is received. As descried above, block 1702 may be performed by the converting module 1606 of the control logic 104. Proceeding to block 1704, the received display data is converted into converted display data based on the identified arrangement of the array of subpixels. As descried above, block 1704 may be performed by the converting module 1606 of the control logic 104. In one example, block 1704 may include blocks 1708 and 1710. At block 1708, one of the three parts of data that represents a color of subpixel other than the corresponding two adjacent subpixels constituting one pixel is identified. Then at block 1710, the identified part of data is removed from the display data to generate the converted display data. Proceeding to block 1706, control signals for rendering the array of subpixels of the display 102 are provided based on the converted display data. As descried above, block 1706 may be performed by the rendering module 1610 of the control logic 104.

Although the processing blocks of FIG. 17 are illustrated in a particular order, those having ordinary skill in the art will appreciate that the processing can be performed in different orders. For example, block 1702 may be performed prior to block 1700 or performed essentially simultaneously. That is, the display data may be received before or at the same time when the subpixel arrangement of the display 102 is identified.

Aspects of the method for rendering subpixels of a display, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another, for example, from a management server or host computer of the search engine operator or other explanation generation service provider into the hardware platform(s) of a computing environment or other system implementing a computing environment or similar functionalities in connection with generating explanations based on user inquiries. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

The above detailed description of the disclosure and the examples described therein have been presented for the purposes of illustration and description only and not by limitation. It is therefore contemplated that the present disclosure cover any and all modifications, variations or equivalents that fall within the spirit and scope of the basic underlying principles disclosed above and claimed herein.

What is claimed is:

1. An apparatus, comprising:
    a display panel comprising an array of 2n subpixels arranged in columns, the array of subpixels forming n pixels (n is a positive integer multiple of 3), wherein (⅔)n subpixels in the array have a first color, (⅔)n subpixels in the array have a second color, and (⅔)n subpixels in the array have a third color, and
    each column of the array comprises at least one of (i) subpixels therein having one of the first, second, and third colors, (ii) subpixels therein having two of the first, second, and third colors, or (iii) subpixels therein having the first, second, and third colors; and
    control logic operatively coupled to the display panel and configured to render the array of subpixels based on display data of a frame, wherein
    the display data of the frame includes n pieces of data, each of which comprising a first component representing the first color, a second component representing the second color, and a third component representing the third color, and
    the control logic is further configured to:
        convert the display data of the frame into converted display data of the frame such that the (⅔)n subpixels having the first color are rendered based on the first components, the (⅔)n subpixels having the second color are rendered based on the second components, and the (⅔)n subpixels having the third color are rendered based on the third components, and
        render each subpixel based on the converted display data of the frame.

2. The apparatus of claim 1, wherein each column of the array comprises subpixels therein having the first, second, and third colors.

3. The apparatus of claim 1, wherein each column of the array comprises subpixels therein having two of the first, second, and third colors.

4. The apparatus of claim 1, wherein the first, second, and third colors are red, green, and blue, respectively.

5. An apparatus, comprising:
    a display panel comprising an array of 2n subpixels comprising a plurality of subpixel groups, the array of subpixels forming n pixels (n is a positive integer multiple of 3), wherein
        (⅔)n subpixels in the array have a first color, (⅔)n subpixels in the array have a second color, and (⅔)n subpixels in the array have a third color,
        each of the plurality of subpixel groups comprises a plurality of subpixel units arranged adjacently, and
        each of the plurality of subpixel units comprises a plurality of subpixels in the same color arranged in a zigzag pattern such that, in each subpixel unit, a first plurality of subpixels are arranged along one diagonal direction from a turning subpixel located at a turning corner of the zigzag pattern, and that a second plurality of subpixels are arranged along another diagonal direction from the turning subpixel; and
    control logic operatively coupled to the display panel and configured to render the array of subpixels based on display data of a frame, wherein
    the display data of the frame includes n pieces of data, each of which comprising a first component representing the first color, a second component representing the second color, and a third component representing the third color, and
    the control logic is further configured to:
        convert the display data of the frame into converted display data of the frame such that the (⅔)n subpixels having the first color are rendered based on the first components, the (⅔)n subpixels having the second color are rendered based on the second components, and the (⅔)n subpixels having the third color are rendered based on the third components, and
        render each subpixel based on the converted display data of the frame.

6. The apparatus of claim 5, wherein each column of the array comprises subpixels therein having at least two colors centered along the same straight line.

7. The apparatus of claim 5, wherein the plurality of subpixel groups repeat along a horizontal direction of the display panel.

8. The apparatus of claim 5, wherein the plurality of subpixel units are arranged adjacently along a horizontal direction or a vertical direction of the display panel.

9. The apparatus of claim 5, wherein the plurality of subpixel units comprise a first subpixel unit having subpixels in red, a second subpixel unit having subpixels in green, and a third subpixel unit having subpixels in blue.

10. The apparatus of claim 5, wherein in each of the plurality of subpixel units, the number of the first plurality of subpixels is different from the number of the second plurality of subpixels.

11. The apparatus of claim 5, wherein in each of the plurality of subpixel units, the number of the first plurality of subpixels is the same as the number of the second plurality of subpixels.

12. The apparatus of claim 5, wherein each subpixel in the array has the same shape and size.

13. The apparatus of claim 12, wherein each subpixel in the array has a substantially rectangular shape with an aspect ratio of about 2:1 or about 1:2.

14. The apparatus of claim 5, wherein each subpixel in the array is a colored subpixel.

15. The apparatus of claim 5, further comprising: a processor configured to generate the display data; and a memory operatively coupled to the processor and the control logic and configured to store the display data.

16. The apparatus of claim 5, wherein each subpixel in the array corresponds to an organic light emitting diode (OLED).

17. The apparatus of claim 5, wherein each subpixel in the array corresponds to a color filter.

18. The apparatus of claim 5, wherein the apparatus is one of a liquid crystal display (LCD), an organic light emitting diode (OLED) display, an electrophoretic ink (E-ink) display, and an electroluminescent display (ELD).

19. An apparatus, comprising:
    a display panel comprising an array of 2n subpixels having a subpixel repeating group tiled across the display panel in a regular pattern, the array of subpixels forming n pixels (n is a positive integer multiple of 3), wherein
    the subpixel repeating group comprises:

| A | B | C |
|---|---|---|
| C | A | B, | where A denotes a subpixel having a first color, B denotes a subpixel having a second color, and C denotes a subpixel having a third color, and ($2/3$)n subpixels in the array have the first color, ($2/3$)n subpixels in the array have the second color, and ($2/3$)n subpixels in the array have the third color; and control logic operatively coupled to the display panel and configured to render the array of subpixels based on display data of a frame, wherein the display data of the frame includes n pieces of data, each of which comprising a first component representing the first color, a second component representing the second color, and a third component representing the third color, and the control logic is further configured to:

convert the display data of the frame into converted display data of the frame such that the ($2/3$)n subpixels having the first color are rendered based on the first components, the ($2/3$)n subpixels having the second color are rendered based on the second components, and the ($2/3$)n subpixels having the third color are rendered based on the third components, and render each subpixel based on the converted display data of the frame.

20. The apparatus of claim 19, wherein A, B, and C each denotes one of a red subpixel, a green subpixel, and a blue subpixel.

21. The apparatus of claim 19, wherein each column of the array comprises subpixels therein having at least two of the first, second, and third colors centered along the same straight line.

* * * * *